(12) United States Patent
Fecher et al.

(10) Patent No.: US 11,746,397 B2
(45) Date of Patent: Sep. 5, 2023

(54) PALLADIUM-COPPER-SILVER-RUTHENIUM ALLOY

(71) Applicant: Heraeus Deutschland GmbH & Co. KG, Hanau (DE)

(72) Inventors: Jonas Fecher, Hanau (DE); Nicole Staudt, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 17/446,209

(22) Filed: Aug. 27, 2021

(65) Prior Publication Data

US 2022/0064761 A1    Mar. 3, 2022

(30) Foreign Application Priority Data

Sep. 1, 2020   (EP) ..................... 20193903

(51) Int. Cl.
*C22C 5/04*        (2006.01)
(52) U.S. Cl.
CPC ..................... *C22C 5/04* (2013.01)
(58) Field of Classification Search
CPC ..................... C22C 5/04; C22F 1/14
See application file for complete search history.

(56) References Cited

U.S. PATENT DOCUMENTS

| | | | |
|---|---|---|---|
| 1,913,423 A | | 6/1933 | Wise |
| 5,833,774 A | | 11/1998 | Klein et al. |
| 6,210,636 B1 | † | 4/2001 | Klein |
| 10,385,424 B2 | | 8/2019 | Klein et al. |
| 2007/0240566 A1 | | 10/2007 | Benn et al. |
| 2010/0194415 A1 | | 8/2010 | Wajata |
| 2014/0266278 A1 | | 9/2014 | Yeh |
| 2014/0377129 A1 | † | 12/2014 | Shishino |
| 2017/0218481 A1 | † | 8/2017 | Klein |
| 2021/0310103 A1 | † | 10/2021 | Takahashi |

FOREIGN PATENT DOCUMENTS

| | | |
|---|---|---|
| GB | 354216 A | 7/1931 |
| JP | 2011122194 A | 6/2011 |
| WO | WO-2016159315 A1 | 10/2016 |
| WO | WO-2019194322 A1 | 10/2019 |

OTHER PUBLICATIONS

Wilson, Brent, Hardness Conversion Chart, 8 pages, Jun. 5, 2014, PGI Steel, retrieved Aug. 2, 2022 from < https://pgisteel.com/hardness-conversion-chart/>.†
Convert ksi to MPa, 3 pages, Chapel Steep Corp., retrieved Aug. 2, 2022 from < https://www.chapelsteel.com/ksi-mpa.html>.†
Conductor Facts: Conversion Factors, 2 pages, Fisk Alloy, Inc., retrieved Aug. 2, 2022 from < https://fiskalloy.com/products/conductor-facts/conversion-factors/>.†

† cited by third party

*Primary Examiner* — Jessee R Roe
(74) *Attorney, Agent, or Firm* — Blank Rome LLP

(57) ABSTRACT

The invention relates to a palladium-copper-silver alloy with palladium as the main component, wherein the palladium-copper-silver alloy has a weight ratio of palladium to copper of at least 1.05 and at most 1.6 and has a weight ratio of palladium to silver of at least 3 and at most 6, and wherein the palladium-copper-silver alloy contains more than 1 wt % and up to a maximum of 6 wt % of ruthenium, rhodium or ruthenium and rhodium and contains, as the remainder, palladium, copper and silver and at most 1 wt % of other metallic elements including impurities. The invention also relates to a wire, a strip or a probe needle made of such a palladium-copper-silver alloy and to the use of such a palladium-copper-silver alloy for testing electrical contacts or for making electrical contact or for producing a sliding contact.

20 Claims, 4 Drawing Sheets

PALLADIUM-COPPER-SILVER-RUTHENIUM ALLOY

CROSS-REFERENCE TO RELATED APPLICATION

Figure 1:
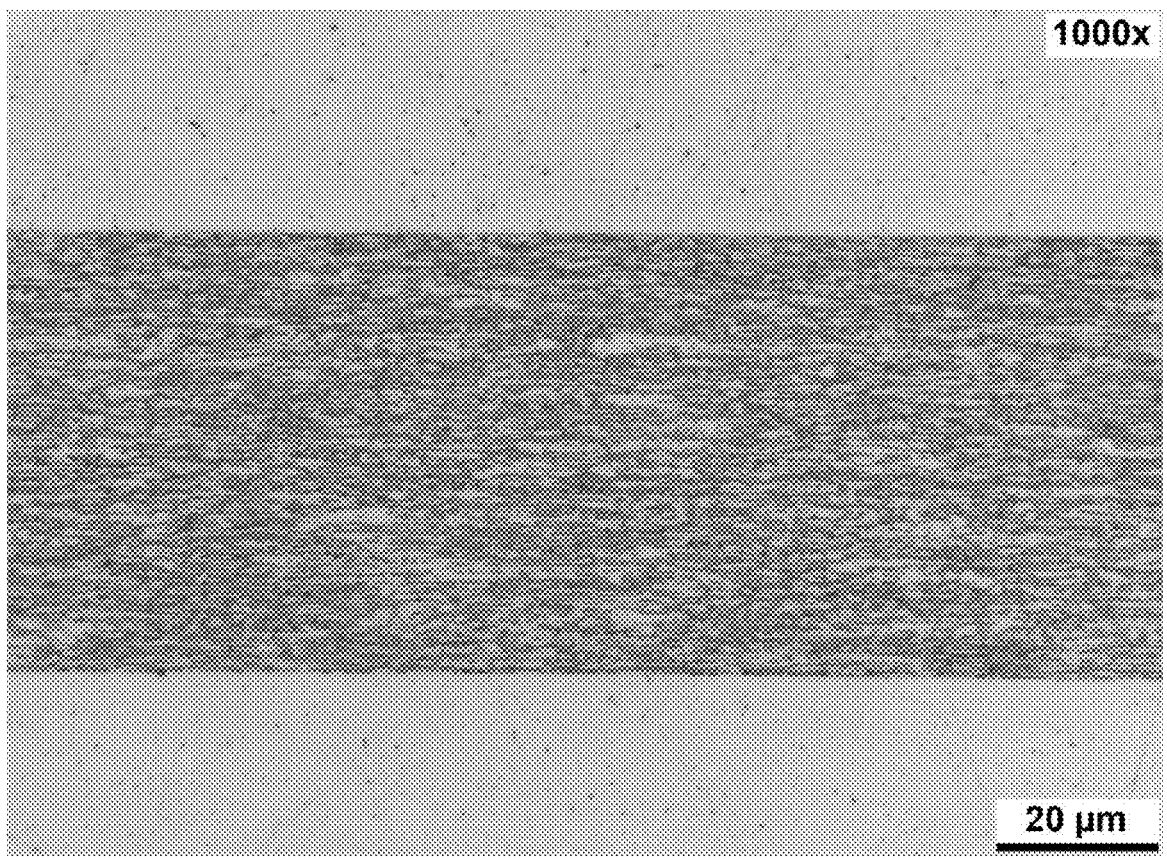

This application claims the benefit of European Application No. 20193903.0 filed Sep. 1, 2020, the entire contents of which are incorporated by reference

DESCRIPTION

The invention relates to a palladium-copper-silver alloy (PdCuAg alloy) and a wire, a strip or a probe needle made of such a palladium-copper-silver alloy and to the use of such a palladium-copper-silver alloy for testing electrical contacts or for making electrical contact or for producing a sliding contact.

During chip production, wafers are contacted with probe needles immediately after processing in order to test the operability of integrated circuits (IC) in the unsawn state. An array of probe needles tests the semiconductor wafer for functionality after the structuring of the individual chips. The probe needles are fixed in a probe card which is matched to the design of the wafer. During the testing process, the wafer is pressed onto the probe needles and contact is established between probe needles and the pads of the ICs, and in the case of aluminum pads is established through a passivation layer. Various parameters are then tested, such as the contacting, the electrical characteristic values at high current density and the electrical behavior during temperature changes.

Probe needles are thus used in the production of power electronics, the contacting of chips and other electrical circuits for testing the quality of electrical contacts (see, for example, US 2014/0266278 A1 and US 2010/0194415 A1).

The key parameters of a good probe needle are high electrical conductivity, since in this case high electrical currents have to be transmitted, and a high degree of hardness in order to keep maintenance intervals short. Currently, metals or alloys which have a high degree of electrical and thermal conductivity but also high degrees of hardness and tensile strength are used for so-called probe needles. The electrical conductivity of pure copper (100% IACS=$58.1*10^6$ S/m) is used as a reference. However, copper (Cu) and silver (Ag) cannot be used for these purposes since they are far too ductile and the probe needle would deform during use.

In addition to probe needles, however, other applications of materials with high electrical and thermal conductivities and simultaneously good mechanical properties, such as high hardness and tensile strength, also benefit, in particular applications such as wires for sliding contacts. In the case of sliding contacts, it is important that, on the one hand, a low contact resistance is caused by the surfaces and, on the other hand, the material does not wear, i.e. abrade or erode, too quickly.

In addition to a high electrical conductivity, applications such as probe needles or sliding wires in power electronics also require high mechanical strength and hardness. In this case, the temperature resistance or the heat resistance is also crucial.

Typical materials for probe needles are precipitation-hardened palladium-silver alloys which can contain 10% gold and 10% platinum and are sold, for example, under the product names Paliney® 7, Hera 6321 and Hera 648. These alloys have a high degree of hardness of 400-500 HV. However, the electrical conductivity is rather low at 9-12% IACS. High conductivity is a crucial factor in probe needles. Probe needles made of the materials tungsten, tungsten carbide, palladium-copper-silver alloys and tungsten-rhenium are widely used for testing on aluminum pads. These are particularly hard, with aluminum pads being more robust than gold pads and being able to withstand a test with hard needles better than gold pads. These probe needles also do not have a very high electrical conductivity. Alloys with higher electrical conductivity such as CuAg7 are less hard (about 320 HV1) and less heat-resistant than palladium-silver alloys or palladium-copper-silver alloys.

Palladium alloys (Pd alloys), such as Paliney® H3C from Deringer Ney or NewTec® from Advanced Probing, for example, are known for use on gold pads. Suitable palladium-copper-silver-alloys are already known from U.S. Pat. No. 1,913,423 A and GB 354 216 A. Palladium-copper-silver alloy can form a structure with a superlattice, which leads to an improvement in the electrical conductivity and the mechanical stability of the alloy. The atoms in the lattice are then no longer statistically randomly distributed, but rather are arranged in periodic structures, the superlattice. As a result, hardnesses of more than 350 HV1 (Vickers hardness test according to DIN EN ISO 6507-1:2018 to -4:2018 with a test force of 9.81 N (1 kilopond)), electrical conductivities of more than 19.5% IACS and breaking strengths of up to 1500 MPa are possible.

US 2014/377129 A1 and U.S. Pat. No. 5,833,774A disclose hardened Ag—Pd—Cu alloys for electrical applications. Such palladium-copper-silver alloys have an electrical conductivity of about 9% to 12% IACS and a hardness of 400 to 500 HV1. A higher electrical conductivity would be desirable. U.S. Pat. No. 10,385,424B2 discloses a palladium-copper-silver alloy additionally containing up to 5 wt % of rhenium. This palladium-copper-silver alloy is sold under the product name Paliney® 25. In this way, the electrical conductivity can be significantly increased and achieves values of more than 19.5% IACS. However, it is disadvantageous that rhenium has a very high melting point of 3180° C. and therefore has to be alloyed in a complicated manner with the other metals. The high density of rhenium (21 g/cm$^3$) also differs considerably from the densities of the other elements (palladium (Pd), copper (Cu) and silver (Ag)), which likewise complicates alloying with the other elements. In addition, rhenium already oxidizes from temperatures above 400° C., which is close to the application temperature of probe needles. Oxides on the surface can limit the function of probe needles and sliding contacts. Furthermore, a further increase in the electrical conductivity and/or the hardness of the alloy for use as a material for probe needles is also desirable.

The invention thus addresses the problem of overcoming the disadvantages of the prior art. In particular, an alloy and a wire, a strip or a probe needle are to be provided which have a high electrical conductivity and, at the same time, a high degree of hardness, but which are simultaneously simple to produce and have as high an oxidation resistance as possible on the surface. The shaped body should be producible as cost-effectively as possible, relative to comparable alloys. The alloy and the products are to be usable as probe needles for testing electrical contacts.

The aim of the invention is thus to find an alloy, such as the known palladium-copper-silver alloys, which combines the mechanical properties (hardness, yield strength, resilient properties) of a known palladium-copper-silver alloy with a higher electrical conductivity. Palladium-copper-silver alloys of this type have a crucial technical advantage, in particular when used as material for probe needles.

A further problem addressed by the invention is that of providing a probe needle which satisfies the aforementioned properties. A further problem can also be considered that of developing a wire for a sliding contact comprising a plurality of wires made of such an alloy.

The problems addressed by the invention are solved by a palladium-copper-silver alloy with palladium as the main component, wherein the palladium-copper-silver alloy has a weight ratio of palladium to copper of at least 1.05 and at most 1.6 and has a weight ratio of palladium to silver of at least 3 and at most 6, and wherein the palladium-copper-silver alloy contains more than 1 wt % and up to a maximum of 6 wt % of ruthenium, rhodium or ruthenium and rhodium and contains, as the remainder, palladium, copper and silver and at most 1 wt % of other metallic elements including impurities.

A weight ratio of palladium to copper of at least 1.05 and at most 1.6 means that the palladium is contained in the palladium-copper-silver alloy with a weight of at least 105% and at most 160% of the weight of the copper contained in the palladium-copper-silver alloy.

Therefore, a weight ratio of palladium to silver of at least 3 and at most 6 means that the palladium is contained in the palladium-copper-silver alloy with a weight of at least three times and at most six times the weight of the silver contained in the palladium-copper-silver alloy.

A mixture of a plurality of elements is preferably understood to mean a mixture in which at least 0.1 wt % of all of these elements is contained in the palladium-copper-silver alloy.

A main component is to be understood in the present case as meaning the element (in this case palladium) which is mainly, i.e. quantitatively, the largest constituent, i.e. in the present case more palladium is present in the palladium-copper-silver alloy than copper or silver.

An impurity is to be understood here as meaning an impurity caused by the presence of all the elements involved.

The palladium-copper-silver alloy is preferably suitable for producing probe needles and/or sliding contacts.

That the alloy contains more than 1 wt % and up to a maximum of 6 wt % of ruthenium and rhodium means that the sum of the proportions by weight of ruthenium and rhodium together make up more than 1 wt % and up to a maximum of 6 wt % of the weight of the entire alloy. Generally, that the alloy contains more or less or exactly X wt % of ruthenium and rhodium means that the sum of the proportions by weight of ruthenium and rhodium together account for the corresponding percentage of X wt % of the weight of the entire alloy.

The alloy particularly preferably has 1.5 wt % of rhodium and ruthenium in the case of a mixture of ruthenium and rhodium.

It can be provided that the impurities in total have a proportion of at most 0.9 wt % in the palladium-copper-silver alloy, preferably of at most 0.1 wt %.

This ensures that the physical properties of the palladium-copper-silver alloy are not influenced or are influenced as little as possible by the impurities.

Furthermore, it can be provided that the palladium-copper-silver alloy contains up to 1 wt % of rhenium, wherein the palladium-copper-silver alloy preferably contains less than 0.1 wt % of rhodium, particularly preferably the palladium-copper-silver alloy contains more than 1 wt % and at most 2 wt % of ruthenium and between 0.1 wt % and 1 wt % of rhenium, very particularly preferably at least 1.1 wt % and at most 1.5 wt % of ruthenium and between 0.2 wt % and 0.8 wt % of rhenium, particularly preferably 1.1 wt % of ruthenium and 0.4 wt % of rhenium.

The palladium-copper-silver alloy contains preferably more than 1 wt % and at most 6 wt % of ruthenium.

This palladium-copper-silver alloy has surprisingly shown in experiments a particularly high electrical conductivity of 28% IACS ($11*10^6$ S/m), simultaneously with a high hardness of 365 HV1. Ruthenium-rhenium precipitates at the grain boundaries of the palladium-copper-silver alloy are presumably responsible for this.

Furthermore, it can be provided that the palladium-copper-silver alloy contains at least 45 wt % and at most 55 wt % of palladium, at least 30 wt % and at most 45 wt % of copper and at least 8 wt % and at most 15 wt % of silver, preferably the palladium-copper-silver alloy contains at least 50 wt % and at most 53 wt % of palladium, at least 35 wt % and at most 38 wt % of copper and at least 9 wt % and at most 12 wt % of silver, and also at least 1.1 wt % up to a maximum of 3 wt % of ruthenium, rhodium or ruthenium and rhodium, particularly preferably the palladium-copper-silver alloy contains at least 51 wt % and at most 52 wt % of palladium, at least 36 wt % and at most 37 wt % of copper and at least 10 wt % and at most 11 wt % of silver, and contains at least 1.1 wt % to a maximum of 2 wt % of ruthenium, rhodium or ruthenium and rhodium and contains at most 0.5 wt % of other metallic elements, in particular between 0.3 wt % and 0.5 wt % of rhenium.

Palladium-copper-silver alloys with these compositions have a particularly high electrical conductivity on account of a superlattice formed in the alloy by a uniform order of the palladium and copper atoms in the crystal lattice instead of a random distribution of the palladium atoms and of the copper atoms in the crystal lattice. Surprisingly, this effect appears to be enhanced by the ruthenium or rhodium precipitates contained in the palladium-copper-silver alloy. At the same time, a high hardness is provided.

It can also preferably be provided that the palladium-copper-silver alloy is produced by melting metallurgy and is subsequently hardened by rolling and tempering, the palladium-copper-silver alloy preferably having a hardness of at least 350 HV1.

In this way, the hardness of the palladium-copper-silver alloy can be improved.

Palladium-copper-silver alloys according to the invention can also be characterized in that the palladium-copper-silver alloy has a hardness of at least 350 HV1.

The invention further relates to palladium-copper-silver alloys according to the invention, characterized in that the palladium-copper-silver alloy has an electrical conductivity of at least 19% IACS.

Palladium-copper-silver alloys according to the invention can also be characterized in that the palladium-copper-silver alloy has a breaking strength of at least 1300 MPa.

Palladium-copper-silver alloys with these physical properties are possible with the additions of ruthenium and rhodium according to the invention and are particularly suitable for the production of probe needles.

It can also be provided that the palladium-copper-silver alloy contains precipitates of ruthenium, rhodium or a mixture of ruthenium and rhodium or a mixture of ruthenium and rhenium, wherein preferably at least 90 vol % of the precipitates are arranged at grain boundaries of the palladium-copper-silver alloy, particularly preferably at least 99 vol % of the precipitates are arranged at grain boundaries of the palladium-copper-silver alloy.

As a result, the mechanical properties, such as the breaking strength and the deformation resistance, for example, are increased. As a result, the palladium-copper-silver alloy is better usable as a probe needle.

Furthermore, it can be provided that the palladium-copper-silver alloy has a weight ratio of palladium to copper of at least 1.2 and at most 1.55, preferably has a weight ratio of palladium to copper of at least 1.3 and at most 1.5, particularly preferably has a weight ratio of palladium to copper of at least 1.35 and at most 1.45, very particularly preferably has a weight ratio of palladium to copper of 1.41.

These weight ratios provide palladium-copper-silver alloys with particularly high electrical conductivity.

It can also be provided that the palladium-copper-silver alloy has a weight ratio of palladium to silver of at least 3.5 and at most 5.5, preferably has a weight ratio of palladium to silver of at least 4 and at most 5.5, particularly preferably has a weight ratio of palladium to silver of at least 4.6 and at most 5.2, very particularly preferably has a weight ratio of palladium to silver of 4.9.

These weight ratios also provide palladium-copper-silver alloys with particularly high electrical conductivity.

It can also preferably be provided that the palladium-copper-silver alloy contains at least 1.1 wt % of ruthenium, rhodium or ruthenium and rhodium.

This improves the electrical conductivity and the mechanical properties of the palladium-copper-silver alloy.

Furthermore, it can be provided that the palladium-copper-silver alloy contains at most 5 wt % of ruthenium, rhodium or ruthenium and rhodium, preferably at most 4 wt % of ruthenium, rhodium or ruthenium and rhodium, particularly preferably at most 3 wt % of ruthenium, rhodium or ruthenium and rhodium, very particularly preferably at most 2 wt % of ruthenium, rhodium or tungsten, ruthenium and rhodium.

These measures also serve to increase the electrical conductivity of the palladium-copper-silver alloy.

It can also be provided that the palladium-copper-silver alloy contains more than 1 wt % and up to a maximum of 6 wt % of rhodium or ruthenium, preferably contains more than 1 wt % and up to a maximum of 3 wt % of rhodium or ruthenium, particularly preferably contains at least 1.1 wt % and up to a maximum of 2 wt % of rhodium or ruthenium, very particularly preferably 1.5 wt % of rhodium or 1.5 wt % of ruthenium.

These palladium-copper-silver alloys are characterized by a particularly high mechanical hardness (HV1).

Alternatively, it can be provided that the palladium-copper-silver alloy contains more than 1 wt % and up to a maximum of 6 wt % of ruthenium and rhenium, preferably contains at least 1.1 wt % and up to a maximum of 3 wt % of ruthenium and rhenium, particularly preferably contains at least 1.1 wt % and up to a maximum of 2 wt % of ruthenium and rhenium, very particularly preferably 1.1 wt % of ruthenium and 0.4 wt % of rhenium.

It can be provided that more ruthenium than rhenium is contained in the palladium-copper-silver alloy.

Palladium-copper-silver alloys of this type are characterized by a particularly high electrical conductivity.

The problems addressed by the present invention are also solved by a wire, a strip or a probe needle consisting of or having a palladium-copper-silver alloy according to the invention, wherein preferably at least one inner core of the wire, the strip or the probe needle consists of the palladium-copper-silver alloy.

Wires, strips and probe needles made of such palladium-copper-silver alloys are particularly well suited for electrical contact measurements due to their high hardness, elasticity and electrical conductivity.

The problems addressed by the present invention are also solved by the use of a palladium-copper-silver alloy according to the invention or the use of a wire or strip according to the invention or the use of a probe needle according to the invention for testing electrical contacts or for electrical contacting or for producing a sliding contact.

The palladium-copper-silver alloy and the wires, strips and probe needles produced therefrom are particularly well suited for these applications.

The invention is based on the surprising finding that the palladium-copper-silver alloys according to the invention combine a high electrical conductivity with a high hardness and breaking strength and are, at the same time, uncomplicated to produce and/or are particularly hard. The density of ruthenium (12.4 g/cm$^3$) and rhodium (12 g/cm$^3$) and the melting points of these metals (2334° C. for ruthenium and 1964° C. for rhodium) are considerably closer to those of palladium, copper and silver and can therefore be more easily alloyed with these metals than metals which have more widely differing densities and melting points, such as rhenium, for example. In addition, the surface of the palladium-copper-silver alloys is oxidation-resistant even at high temperatures around 400° C. Ruthenium and rhodium form oxides only from about 700° C. The wires, strips and probe needles produced from the alloys according to the invention have the corresponding advantageous properties. Even electrical conductivities of 27% and 28% IACS could be achieved if a palladium-copper-silver alloy with ruthenium or ruthenium and rhenium is measured. A surprisingly high hardness could be achieved with a palladium-copper-silver alloy containing rhodium.

Electrical conductivities of 23% IACS or even more are possible with the present invention. 100% IACS corresponds to 58 m/($\Omega \cdot$mm$^2$).

The use of ruthenium or rhodium as an alloy constituent of palladium-copper-silver alloys is surprising when compared to the use of rhenium because of the different chemical properties of these elements. Compared to rhenium, rhodium and ruthenium are both in a different main group and in a different period of the periodic table, which, in a first approximation, suggests very different properties and different alloy behavior. Rhodium and ruthenium are platinum group metals, whereas rhenium belongs to the same group as manganese, and so no similarity in properties is expectable. Rhenium has a hexagonal crystal structure, whereas rhodium has a face-centered cubic structure.

Ruthenium has lower solubility in silver than rhenium ($2.65 \times 10^{-4}$ for ruthenium, compared with $1.44 \times 10^{-3}$ for rhenium). This should have a positive effect on the electrical conductivity of the palladium-copper-silver alloy according to the invention.

In addition, in electron microscopy studies, ruthenium precipitates have been found at the grain boundaries in palladium-copper-silver alloys containing 1.1 wt % to 1.5 wt % of ruthenium. These can lead to a greater hardness of the palladium-copper-silver alloy by precipitation hardening.

The palladium-copper-silver alloy according to the invention is characterized by a high hardness, good resilient properties and, at the same time, good electrical conductivity. It is therefore ideally suited for use as a material for producing probe needles.

For a weight ratio (1.05 to 1.6) of palladium and copper, an ordered superstructure in the crystal lattice (also referred to as a superlattice) can be set by appropriate heat treatment. The regular arrangement of the palladium and copper atoms results in both the hardness and the electrical conductivity of the palladium-copper-silver alloy increasing. The alloying of silver in a ratio of palladium to silver between 3 and 6 permits an additional increase in strength by precipitation hardening. The alloying of ruthenium, rhodium or ruthenium and rhodium in the range of 1 wt % to 6 wt % surprisingly contributes to the formation of fine grains, which positively influences the hardness and formability of the palladium-copper-silver alloy. In addition, the ruthenium, rhodium or the mixture thereof, which are presumably arranged preferably at the grain boundaries, prevents grain growth and creep at the operating temperature. This results in a greater durability of probe needles produced therefrom. Up to 1 wt % of rhenium can be alloyed with the ruthenium. The electrical conductivity achieved at 27% to 30% IACS with a hardness of more than 400 HV is particularly suitable for use as a probe needle. Thus, the physical properties of the palladium-copper-silver alloy according to the invention with ruthenium in respect of electrical conductivity and hardness are also better than that of Paliney® 25.

Exemplary embodiments of the invention are explained below, without, however, limiting the invention.

The palladium-copper-silver alloys described below were produced by first producing master alloys by induction melting. Palladium-ruthenium, palladium-rhenium and palladium-rhodium master alloys were produced as master alloys. Because of the melting temperatures and densities of the elements palladium, ruthenium and rhodium, which are not very different from one another, the production of the master alloys is straightforward and cost-effective without great effort.

These master alloys were then alloyed with copper and silver by arc melting. The shaped bodies thus melted are then shaped and hardened by heat treatments and rolling. For this purpose, the shaped bodies were tempered at 900° C. for 120 minutes and quenched. They were rolled at room temperature with several intermediate annealing operations at 900° C. and for 120 minutes at 0.4 mm and then kept at 380° C. for 1.5 hours, as a result of which a hardening effect occurs.

The electrical conductivity was then determined using four-point measurement. The four-point measurement method, also four-terminal sensing, four-wire sensing or Kelvin sensing, is a method for determining sheet resistance, i.e. the electrical resistance of a surface or thin layer. In the method, four measuring points are placed in a row on the surface of the film, wherein a known current flows via the two outer measuring points and the potential difference, i.e. the electrical voltage between two inner measuring points, is measured using these two inner measuring points. Since the method is based on the principle of four-wire measurement, it is largely independent of the contact resistance between the measuring points and the surface (Thomson bridge principle). Adjacent measuring points each have the same spacing. The sheet resistance R is calculated from the measured voltage U and the current I according to the formula:

$$R = \frac{\pi}{\ln 2} \frac{U}{I}$$

In order to calculate the specific resistance ρ of the layer material from the sheet resistance R, it is multiplied by the thickness d (layer thickness) of the film:

ρ=dR

The electrical conductivity follows from the inverse of the specific resistance.

The hardness was examined (HV1—Vickers hardness test according to DIN EN ISO 6507-1:2018 to −4:2018 with a test force of 9.81 N (1 kilopond)), the strength was examined by means of tensile tests and the microstructure was examined by means of metallographic sections.

The following palladium-copper-silver alloys were produced and examined:
1. 51.5 Pd, 36.5 Cu, 10.5 Ag, 1.5 Ru (PdCuAgRu)
2. 51.5 Pd, 36.5 Cu, 10.5 Ag, 1.1 Ru, 0.4 Re (PdCuAgRuRe)
3. 51.5 Pd, 36.5 Cu, 10.5 Ag, 1.5 Rh (PdCuAgRh)

The data always refer to percent by weight (wt %) in the alloy. In addition, the alloys contain conventional impurities with a concentration of less than 0.1 wt %.

For comparison, a palladium-copper-silver alloy by the product name Hera 6321 with a composition of 39 wt % of Pd, 31 wt % of Cu, 29 wt % of Ag, 0.9 wt % of Zn and 0.1 wt % of B was also examined.

TABLE 1

The measurement results of the electrical conductivity (IACS) and the hardness for the alloys examined are listed below.

|  | IACS [%] | Hardness [HV1] | Yield strength [MPa] |
| --- | --- | --- | --- |
| Hera 6321 | 9-12 | 400-500 | 1300 |
| PdCuAgRu | 27 | 360 | 1100 |
| PdCuAgRuRe | 28 | 365 | 1050 |
| PdCuAgRh | 23 | 429 | 1100 |

The measurements of the PdCuAgRu alloy, the PdCuAgRuRe alloy and the PdCuAgRh alloy were carried out on metal sheets having a thickness of 0.4 mm. The Hera-6321 alloy was measured on a metal sheet with a thickness of 54 μm.

Figure 2:
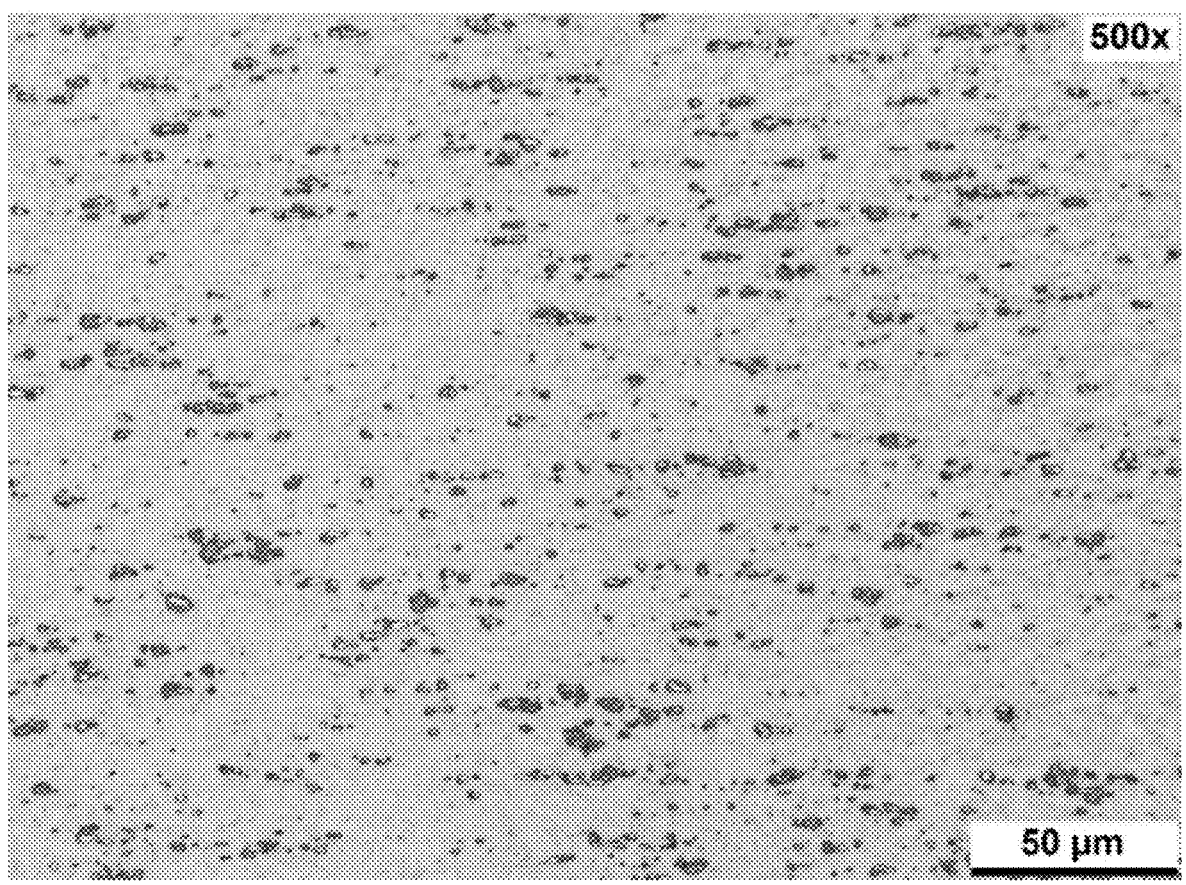
Figure 3:
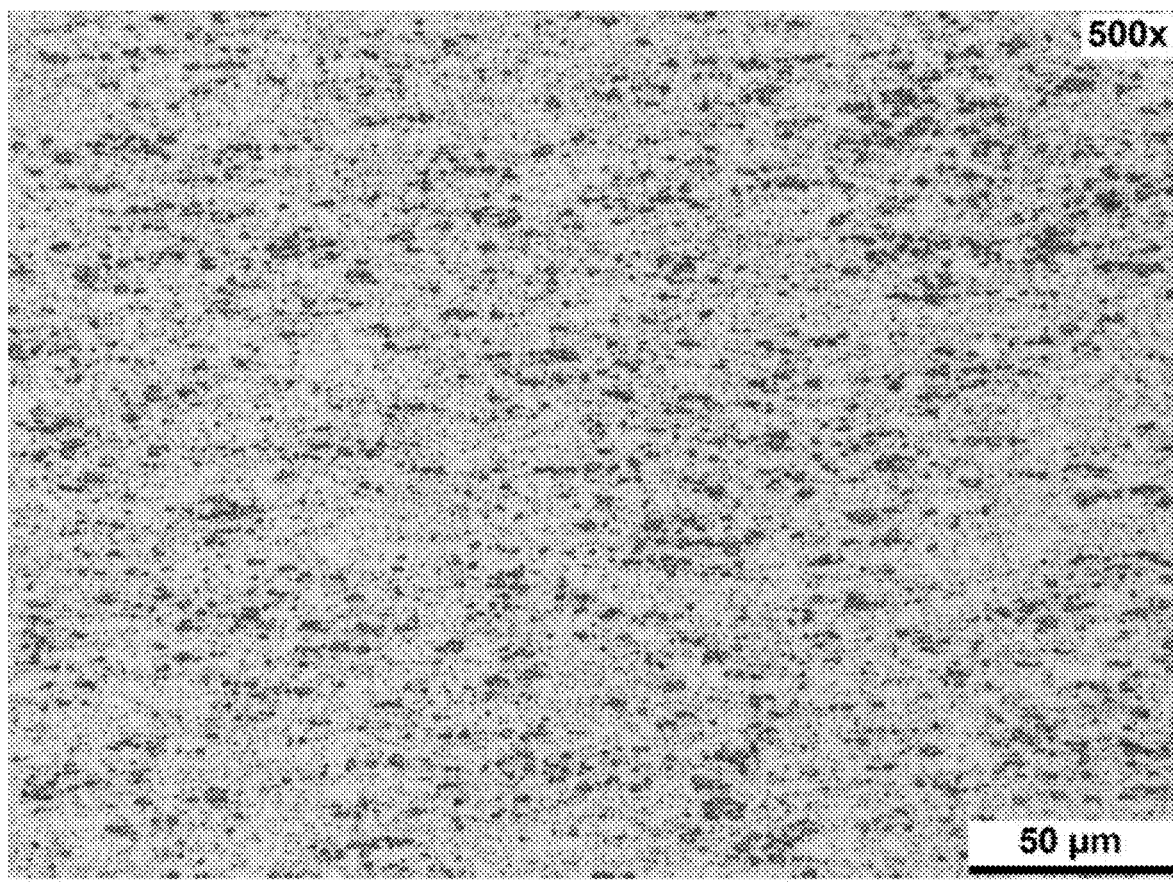

Microstructure images of the examined alloys are explained below with reference to four figures, in which:

FIG. 1: shows a microstructure image of the examined Hera-6321 alloy;

FIG. 2: shows a microstructure image of the examined PdCuAgRu alloy;

FIG. 3: shows a microstructure image of the examined PdCuAgRuRe alloy; and

Figure 4:
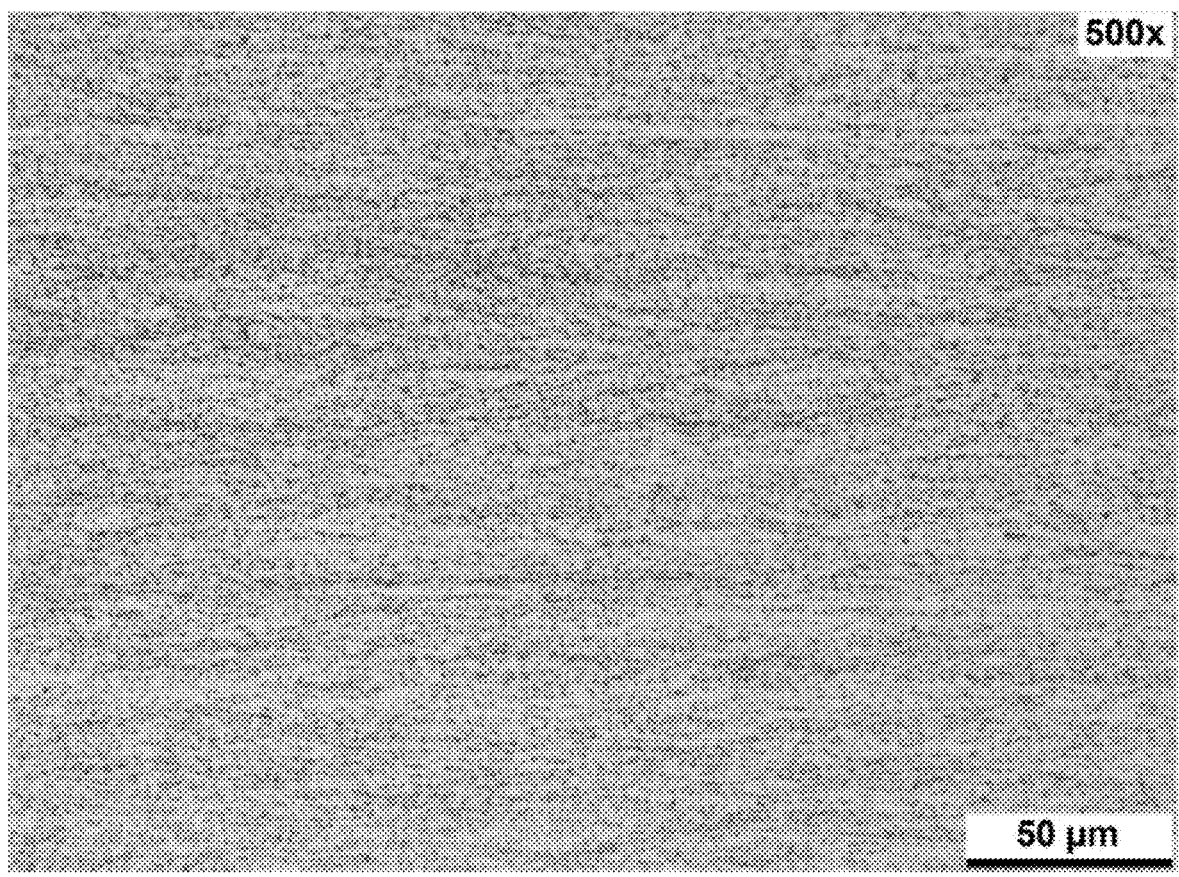

FIG. 4: shows a microstructure image of the examined PdCuAgRh alloy.

All the microstructure images (FIGS. 1 to 4) show the alloys in the precipitation-hardened state. The images were taken by imaging sections through the alloys using a light microscope (reflected light microscope, bright field). The surfaces were prepared with microstructure etches to make the precipitates more visible. In FIGS. 2 to 4, the precipitates are shown in the alloys as dark contrasts in the bright matrix of the precious metal alloy. In FIG. 1, the silver precipitates in the alloy can be seen as bright contrasts in the dark matrix.

The precipitates are smaller and more dispersed in the PdCuAgRuRe alloy than in the PdCuAgRu alloy. The PdCuAgRh alloy has the smallest precipitates. However, the size of the precipitates is not a measure of the quality of the alloys.

The measurements show the high electrical conductivity of the palladium-copper-silver alloys according to the invention, which contain more than 1 wt % of ruthenium, rhodium or ruthenium and rhodium, compared to Hera 6321 (between 2.3 times and 3 times as high). At the same time, the hardness of the palladium-copper-silver alloys with ruthenium or rhodium is only slightly (about 10%) less than the hardness of Hera 6321. The palladium-copper-silver alloys containing ruthenium even have a somewhat higher electrical conductivity than the palladium-copper-silver alloys according to U.S. Ser. No. 10/385,424 B1. The palladium-copper-silver alloys containing rhodium are characterized by a higher hardness.

The features of the invention disclosed in the above description as well as in the claims, figures and exemplary embodiments can be essential both individually and in any combination for realizing the invention in its various embodiments.

The invention claimed is:

1. A palladium-copper-silver alloy with palladium as the main component, wherein the palladium-copper-silver alloy
   has a weight ratio of palladium to copper of at least 1.05 and at most 1.6,
   has a weight ratio of palladium to silver of at least 3 and at most 6,
   contains at least 1.5 wt % and up to a maximum of 6 wt % of ruthenium, or contains more than 1 wt % and up to a maximum of 6 wt % of rhodium or a mixture of ruthenium and rhodium, and
   contains at most 1 wt % of other metallic elements including impurities.

2. The palladium-copper-silver alloy of claim 1, wherein the impurities in total have a proportion of at most 0.9 wt % in the palladium-copper-silver alloy.

3. The palladium-copper-silver alloy of claim 1, wherein the palladium-copper-silver alloy contains up to 1 wt % of rhenium.

4. The palladium-copper-silver alloy of claim 1, wherein the palladium-copper-silver alloy contains at least 45 wt % and at most 55 wt % of palladium, at least 30 wt % and at most 45 wt % of copper, at least 8 wt % and at most 15 wt % of silver.

5. The palladium-copper-silver alloy of claim 1, wherein the palladium-copper-silver alloy is produced by melting metallurgy and is subsequently hardened by rolling and tempering.

6. The palladium-copper-silver alloy of claim 1, wherein the palladium-copper-silver alloy has a hardness of at least 350 HV1 and/or has an electrical conductivity of at least 19% IACS ($11*10^6$ S/m) and/or has a breaking strength of at least 1300 MPa.

7. The palladium-copper-silver alloy of claim 1, wherein the palladium-copper-silver alloy contains precipitates of ruthenium, rhodium, a mixture of ruthenium and rhodium, or a mixture of ruthenium and rhenium.

8. The palladium-copper-silver alloy of claim 7, wherein at least 90 vol % of the precipitates are arranged at grain boundaries of the palladium-copper-silver alloy.

9. The palladium-copper-silver alloy of claim 1, wherein the palladium-copper-silver alloy has a weight ratio of palladium to copper of at least 1.2 and at most 1.55.

10. The palladium-copper-silver alloy of claim 1, wherein the palladium-copper-silver alloy has a weight ratio of palladium to silver of at least 3.5 and at most 5.5.

11. The palladium-copper-silver alloy of claim 1, wherein the palladium-copper-silver alloy contains at most 5 wt % of ruthenium, rhodium or a mixture of ruthenium and rhodium.

12. The palladium-copper-silver alloy of claim 1, wherein the palladium-copper-silver alloy contains up to 3 wt % of rhodium or ruthenium.

13. The palladium-copper-silver alloy of claim 1, wherein the palladium-copper-silver alloy contains up to 3 wt % of a combination of ruthenium and rhenium.

14. A wire, strip or probe needle consisting of or having a palladium-copper-silver alloy according to claim 1.

15. A method, comprising:
    testing electrical contacts, forming an electrical contact, or producing a sliding contact using a wire, strip or probe needle according to claim 14.

16. A method, comprising:
    testing electrical contacts, forming an electrical contact, or producing a sliding contact using a palladium-copper-silver alloy according to claim 1.

17. The palladium-copper-silver alloy of claim 1, wherein the palladium-copper-silver alloy contains between 0.1 wt % and 1 wt % of rhenium.

18. The palladium-copper-silver alloy of claim 1, wherein the palladium-copper-silver alloy contains between 0.2 wt % and 0.8 wt % of rhenium.

19. The palladium-copper-silver alloy of claim 1, wherein the palladium-copper-silver alloy contains at least 51 wt % and at most 52 wt % of palladium, at least 36 wt % and at most 37 wt % of copper, at least 10 wt % and at most 11 wt % of silver, at least 1.5 wt % and at most 2 wt % of ruthenium, rhodium or a mixture of ruthenium and rhodium, and at most 0.5 wt % of other metallic elements.

20. A palladium-copper-silver alloy with palladium as the main component, wherein the palladium-copper-silver alloy
    has a weight ratio of palladium to copper of at least 1.05 and at most 1.6,
    has a weight ratio of palladium to silver of at least 3 and at most 6,
    contains more than 1 wt % and up to a maximum of 6 wt % of rhodium or more than 1 wt % and up to a maximum of 6 wt % of a mixture of ruthenium and rhodium, and
    contains at most 1 wt % of other metallic elements including impurities.

* * * * *